(12) United States Patent
Friedrich et al.

(10) Patent No.: US 11,818,836 B2
(45) Date of Patent: Nov. 14, 2023

(54) SYSTEMS FOR ELECTROSTATIC DISCHARGE PROTECTION

(71) Applicant: CommScope Technologies LLC, Hickory, NC (US)

(72) Inventors: Rainer Friedrich, Maihingen (DE); Johannes Steigert, Harburg (DE)

(73) Assignee: CommScope Technologies LLC, Hickory, NC (US)

( * ) Notice: Subject to any disclaimer, the term of this patent is extended or adjusted under 35 U.S.C. 154(b) by 353 days.

(21) Appl. No.: 17/152,540

(22) Filed: Jan. 19, 2021

(65) Prior Publication Data

US 2021/0243888 A1    Aug. 5, 2021

Related U.S. Application Data

(60) Provisional application No. 62/969,470, filed on Feb. 3, 2020.

(51) Int. Cl.
*H05K 1/00* (2006.01)
*H05K 1/02* (2006.01)

(52) U.S. Cl.
CPC ......... *H05K 1/0243* (2013.01); *H05K 1/0259* (2013.01); *H05K 2201/10098* (2013.01); *H05K 2201/10189* (2013.01)

(58) Field of Classification Search
CPC .............. H05K 1/0243; H05K 1/0259; H05K 2201/10098; H05K 2201/10189
See application file for complete search history.

(56) References Cited

U.S. PATENT DOCUMENTS

| | | | |
|---|---|---|---|
| 7,030,712 B2* | 4/2006 | Brunette | H05K 1/0222 333/260 |
| 7,430,103 B2 | 9/2008 | Kato | |
| 7,948,726 B2* | 5/2011 | Troemel, Jr. | H01T 4/08 361/118 |
| 9,728,957 B2 | 8/2017 | Gao et al. | |
| 9,730,228 B2 | 8/2017 | Harel | |
| 10,693,226 B2* | 6/2020 | Lin | H02H 9/041 |
| 10,797,781 B2* | 10/2020 | Bennett | H04L 5/14 |
| 2006/0205342 A1* | 9/2006 | McKay | H04B 3/36 455/11.1 |
| 2008/0117117 A1* | 5/2008 | Washiro | H04B 5/02 343/850 |
| 2011/0309993 A1* | 12/2011 | He | H01Q 9/0421 343/860 |

FOREIGN PATENT DOCUMENTS

KR    100598433 B1    7/2006

OTHER PUBLICATIONS

CN107786215 A; English Translation; published in 2018 (Year: 2018).*

(Continued)

*Primary Examiner* — Pete T Lee
(74) *Attorney, Agent, or Firm* — Fogg & Powers LLC (57) ABSTRACT

In one example, a system includes a radio frequency port coupled to an external connector and a microstrip line coupled to the radio frequency port and one or more components mounted on a printed circuit board. The system further includes a short coupled to the microstrip line and a ground reference, wherein the short is coupled to the microstrip line proximate the radio frequency port.

16 Claims, 4 Drawing Sheets

(56) References Cited

OTHER PUBLICATIONS

CN 104392587 English Translation; published in 2015 (Year: 2015).*
International Searching Authority, "International Search Report and Written Opinion from PCT Application No. PCT/US2021/013992", from Foreign Counterpart to U.S. Appl. No. 17/152,540, filed May 12, 2021, pp. 1 through 10, Published: WO.

* cited by examiner

SYSTEMS FOR ELECTROSTATIC DISCHARGE PROTECTION

CROSS-REFERENCE TO RELATED APPLICATIONS

This application claims the benefit of U.S. Provisional Application Ser. No. 62/969,470, filed Feb. 3, 2020, and titled "SYSTEMS FOR ELECTROSTATIC DISCHARGE PROTECTION," which is hereby incorporated herein by reference.

BACKGROUND

Electrostatic discharge (ESD) is a hazard that can endanger equipment located in close proximity to operable RF and DC signal circuits and transmitters. For example, when an antenna is decoupled from the antenna port of operating transceiver electronics, electrostatic charges can develop at the antenna port. If equipment comes within a sufficient proximity of the electrostatically charged antenna port, a path to ground may be created that allows a discharge current to flow through the equipment causing substantial harm. In order to attempt to mitigate such hazards, ESD protection diodes have been coupled to a transmitter's output to shunt ESD to ground. However, such techniques introduce a capacitance onto the antenna port that reduces transmission performance, particularly for higher power applications (for example, 2 Watts).

SUMMARY

In one example, a system includes a radio frequency port coupled to an external connector and a microstrip line coupled to the radio frequency port and one or more components mounted on a printed circuit board. The system further includes a short coupled to the microstrip line and a ground reference, wherein the short is coupled to the microstrip line proximate the radio frequency port.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be used and that logical, mechanical, and electrical changes may be made. The following detailed description is, therefore, not to be taken in a limiting sense.

The example systems described herein provide better ESD protection for equipment while maintaining low insertion loss and return loss. The ESD protection circuit in the example systems includes a microstrip line from one or more components of a printed circuit board (PCB) to a radio frequency port. The ESD protection circuit also includes a short coupled to the microstrip line and a ground reference, and the short is positioned proximate to the radio frequency port. The example systems described herein are not limited to particular RF system architectures, but may be used in conjunction with wireless network access points (for example, IEEE 802.11 (Wi-Fi) access points), distributed antenna systems, RF repeaters, cellular communications base stations, small cell base stations, or other RF signal transport, processing, or transceiver devices.

Figure 1:
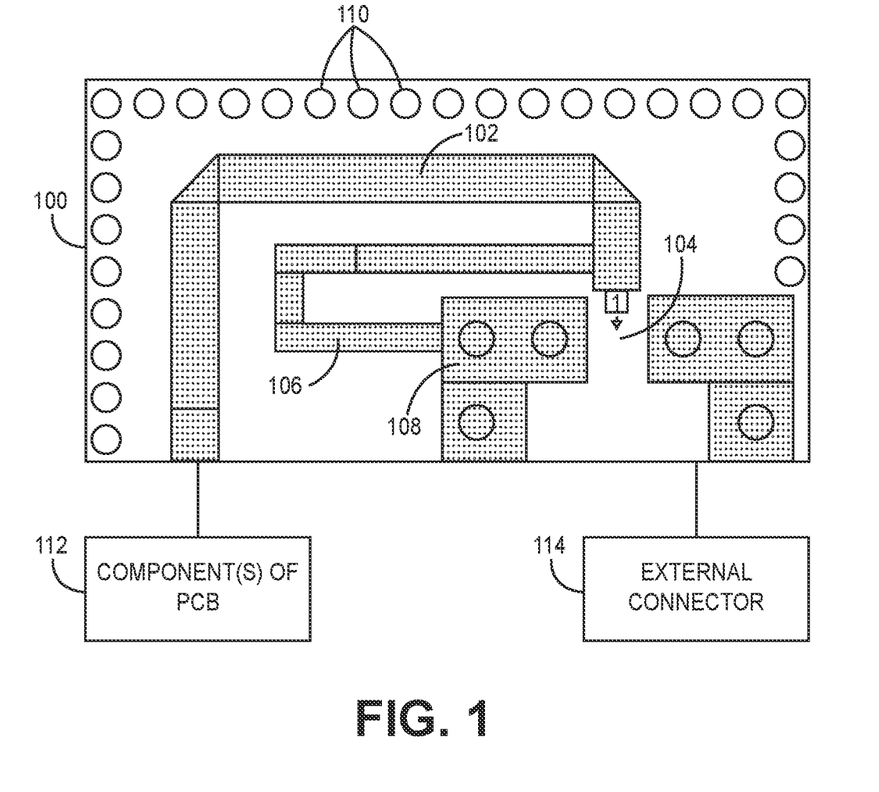
FIG. 1 is a top view of an example ESD protection circuit.

FIG. 1 is a top view of an example ESD protection circuit 100 that can be included in a device. In the example of FIG. 1, the ESD protection circuit 100 includes a microstrip line 102, a radio frequency port 104, and a short 106 coupled to a ground reference 108. While a single instance of each component is shown in FIG. 1, it should be understood that this is for ease of illustration and the device can include one or more of the components shown in FIG. 1. For example, a device may include multiple ESD protection circuits 100 or a single ESD protection circuit 100 could include more than one of the components discussed above.

The microstrip line 102 is coupled to one or more components 112 of a PCB and the radio frequency port 104. In some examples, the microstrip line 102 is configured to have a characteristic impedance matched to the system impedance (for example, 50 Ohms). In some examples, the microstrip line 102 includes one or more mitered bends or corners. For example, the microstrip line 102 shown in FIG. 1 includes two mitered bends. In some examples, the one or more components 112 of the PCB include RF transmitter or receiver circuits and/or other RF signal processing or DC electronics mounted to the PCB. The microstrip line 102 can function as a transmission line from the one or more components 112 of the PCB to the radio frequency port 104.

The radio frequency port 104 is coupled to the end of the microstrip line 102 opposite the one or more components 112 of the PCB. In some examples, the radio frequency port 104 is coupled to an external connector 114, which could be an external RF connector. In some examples, the external connector 114 is configured to be coupled to an antenna or other RF device (not shown). In some examples, the radio frequency port 104 is an output port of the device. In some examples, the radio frequency port 104 is an input port of the device. As discussed above, the external RF connector is a potential source of ESD, particularly when it is being coupled or decoupled.

In order to prevent ESD from damaging the one or more components 112 of the PCB, the short 106 of the ESD protection circuit 100 is coupled to the microstrip line 102 at a point that is proximate to the radio frequency port 104. In some examples, the short 106 is coupled to the microstrip line 102 as close as possible to the radio frequency port 104. The other end of the short 106 is coupled to a ground reference 108. In some examples, the ground reference 108 is a ground pin of the radio frequency port 104 or the ground pin of another input port or output port of the device. In some examples, the ground reference 108 is also positioned as close as possible to the radio frequency port 104 of the device.

In some examples, the short 106 is configured to have a higher characteristic impedance than the microstrip line 102. For example, if the microstrip line 102 has a characteristic impedance of 50 Ohms, the short 106 can be configured to have a characteristic impedance that is greater than 50 Ohms (for example, 75 Ohms). In some examples, the short 106 is configured to have a length that is a quarter wavelength of the operating frequency of the RF signals transmitted or received via the radio frequency port 104. In some examples, the short 106 is configured to operate as an open circuit for the operating frequency of the RF signals transmitted or received via the radio frequency port 104. For example, the width and length of the short can be chosen during design such that the short 106 operates as an open circuit for the operating frequency of the RF signals transmitted or received via the radio frequency port 104.

The higher characteristic impedance of the short 106 helps to avoid additional insertion loss on the microstrip line 102, which can function as the output transmission line of the device. It has been observed that the ESD protection circuit 100 shown in FIG. 1, through the inductive impact of the short 106, has better matching to 50 Ohms for the operating frequency of the RF signals transmitted or received via the radio frequency port 104 than if the short 106 were not included. Further, the ESD protection circuit 100 has a less negative effect on passive intermodulation (PIM) performance of the device like previous designs using ESD protection diodes.

Figure 2:
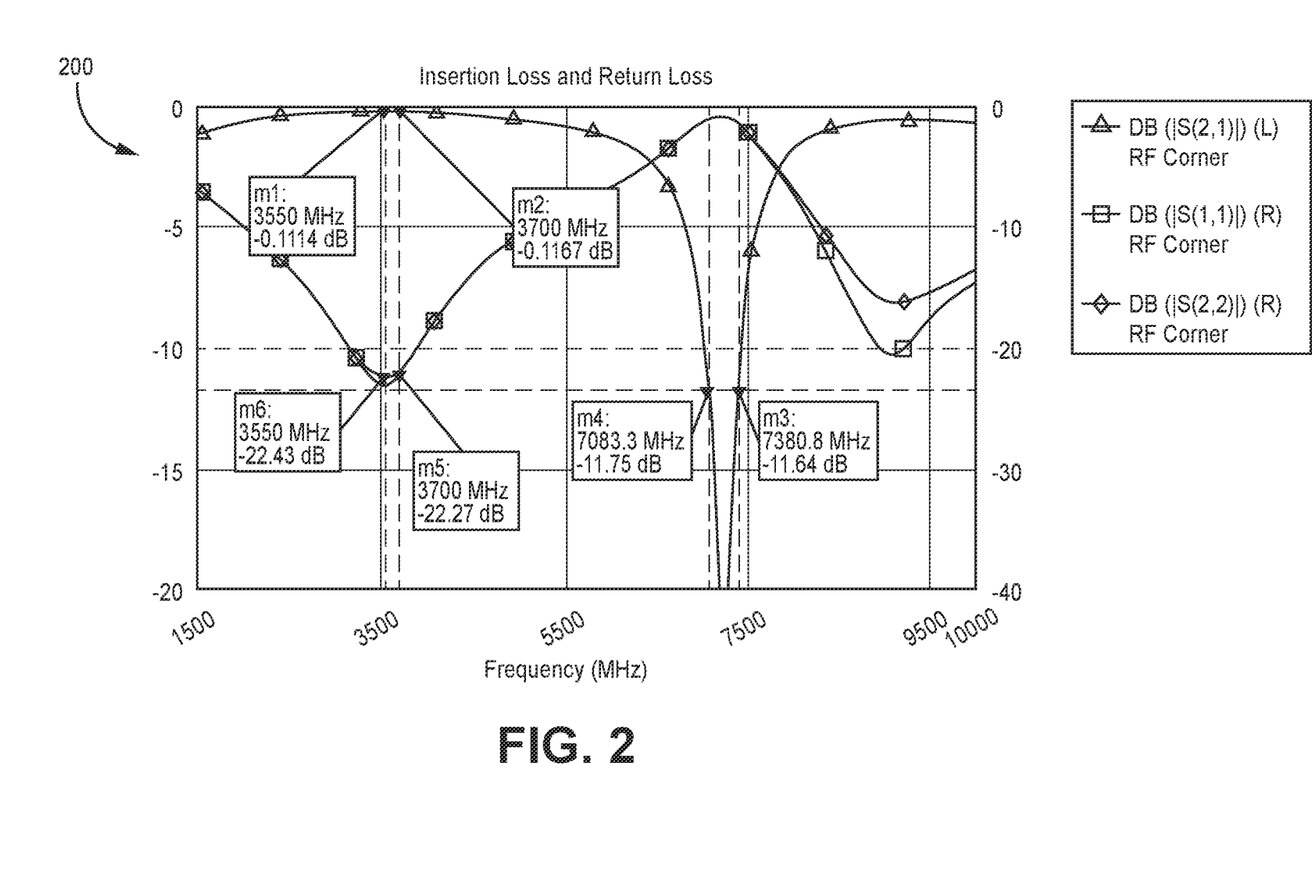
FIG. 2 is a graph illustrating simulated insertion loss and return loss for an ESD protection circuit.

FIG. 2 is a graph illustrating simulated insertion loss and return loss for an ESD protection circuit. In particular, FIG. 2 illustrates simulation results for a 3.55-3.7 GHz Citizens Broadband Radio Service (CBRS) band with an ESD protection circuit as shown in FIG. 1. The output 50 Ohm line has a low insertion loss (approximately 0.08 dB) for the 50 Ohm line and 0.03 dB additional loss for the ESD protection for approximately 0.11 dB of total loss. In some examples, the short 106 is also configured to suppress one or more harmonics of an operating frequency for the RF signals transmitted via the radio frequency port 104. With this additional suppression of harmonics provided by the short 106, the size of output filters, loss, and power consumption could be reduced for the device. In the example results shown in FIG. 2, the harmonic suppression is greater than 10 dB at 7.1-7.4 GHz.

In some examples, the ESD protection circuit 100 is mounted to the same circuit board as the one or more components 112. In other examples, the ESD protection circuit 100 is mounted to a different circuit board than the one or more components 112 shown in FIG. 1. For example, the one or more components 112 could be mounted to a first circuit board and the components of the ESD protection circuit 100 could be mounted on a second circuit board. In some examples, the first circuit board and the second circuit board each include compatible edge connector interface hardware that electrically couple the one or more components 112 to the ESD protection circuit 100.

In some examples, the PCB that includes the ESD protection circuit 100 is a multi-layer PCB. In such examples, the ESD protection circuit 100 includes a plurality of ground vias 110, which are included from the top layer to the bottom layer to keep the ESD pulses energy within a restricted area close to the radio frequency port 104. In some examples, the plurality of ground vias 110 are positioned around the perimeter of portion of the circuit board on which the ESD protection circuit 100 is mounted.

As mentioned above, the ESD protection circuit 100 described herein can be used in conjunction with any number of RF circuits and system architectures such as, but not limited to: wireless network access points, distributed antenna systems, RF repeaters, cellular communications base stations, and small cell base stations.

Figure 3:
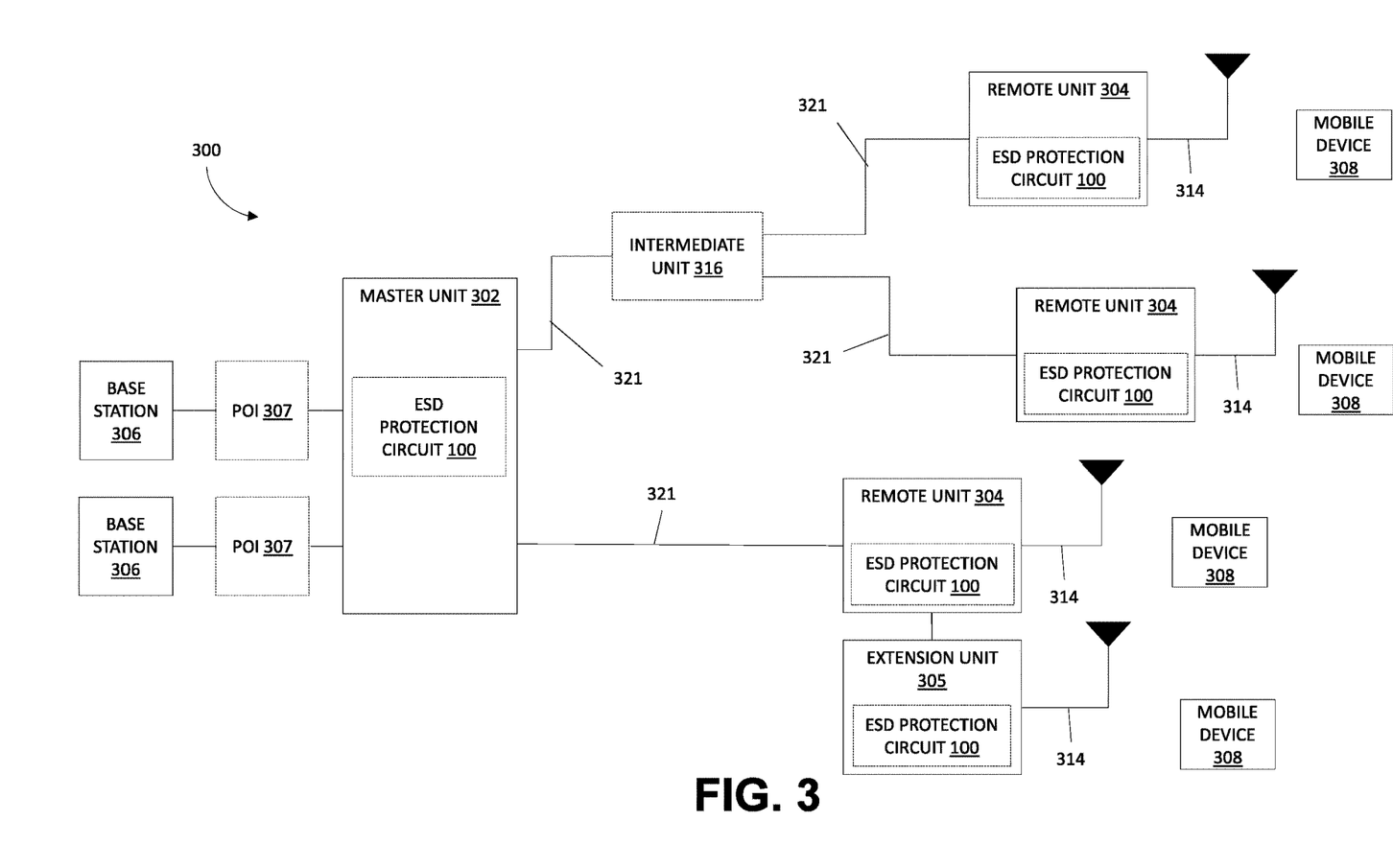
FIG. 3 is a block diagram illustrating an example distributed antenna system utilizing an ESD protection circuit.

FIG. 3 is a block diagram of an example distributed antenna system (DAS) 300 that includes the ESD protection circuit 100 in one or more components of the DAS 300. In the example of FIG. 3, the DAS 300 includes one or more master units 302 (also referred to as "host units" or "central area nodes" or "central units") and one or more remote antenna units 304 (also referred to as "remote units" or "radiating points") that are communicatively coupled to the one or more master units 302. In this example, the DAS 300 comprises a digital DAS, in which DAS traffic is distributed between the master units 302 and the remote antenna units 304 in digital form. The DAS 300 can be deployed at a site to provide wireless coverage and capacity for one or more wireless network operators. The site may be, for example, a building or campus or other grouping of buildings (used, for example, by one or more businesses, governments, or other enterprise entities) or some other public venue (such as a hotel, resort, amusement park, hospital, shopping center, airport, university campus, arena, or an outdoor area such as a ski area, stadium or a densely-populated downtown area).

The master unit 302 is communicatively coupled to the plurality of base stations 306. One or more of the base stations 306 can be co-located with the respective master unit 302 to which it is coupled (for example, where the base station 306 is dedicated to providing base station capacity to the DAS 300). Also, one or more of the base stations 306 can be located remotely from the respective master unit 302 to which it is coupled (for example, where the base station 306 is a macro base station providing base station capacity to a macro cell in addition to providing capacity to the DAS 300). In this latter case, a master unit 302 can be coupled to a donor antenna using an over-the-air repeater in order to wirelessly communicate with the remotely located base station.

The base stations 306 can be implemented in a traditional manner in which a base band unit (BBU) is deployed at the same location with a radio head (RRH) to which it is coupled, where the BBU and RRH are coupled to each other using optical fibers over which front haul data is communicated as streams of digital IQ samples (for example, in a format that complies with one of the Common Public Radio Interface (CPRI), Open Base Station Architecture Initiative (OBSAI), and Open RAN (O-RAN) families of specifications). Also, the base stations 306 can be implemented in other ways (for example, using a centralized radio access network (C-RAN) topology where multiple BBUs are deployed together in a central location, where each of BBU is coupled to one or more RRHs that are deployed in the area in which wireless service is to be provided. Also, the base station 306 can be implemented as a small cell base station in which the BBU and RRH functions are deployed together in a single package.

The master unit 302 can be configured to use wideband interfaces or narrowband interfaces to the base stations 306. Also, the master unit 302 can be configured to interface with the base stations 306 using analog radio frequency (RF) interfaces or digital interfaces (for example, using a CPRI, OB SAI, or O-RAN digital interface). In some examples, the master unit 302 interfaces with the base stations 306 via one or more wireless interface nodes (not shown). A wireless interface node can be located, for example, at a base station hotel, and group a particular part of a RF installation to transfer to the master unit 302.

Traditionally, a master unit 302 interfaces with one or more base stations 306 using the analog radio frequency signals that each base station 306 communicates to and from a mobile device 308 (also referred to as "mobile units" or "user equipment") of a user using a suitable air interface standard. Although the devices 308 are referred to here as "mobile" devices 308, it is to be understood that the devices 308 need not be mobile in ordinary use (for example, where the device 308 is integrated into, or is coupled to, a sensor unit that is deployed in a fixed location and that periodically wirelessly communicates with a gateway or other device). The DAS 300 operates as a distributed repeater for such radio frequency signals. RF signals transmitted from each base station 306 (also referred to herein as "downlink RF signals") are received at the master unit. In such examples, the master unit 302 uses the downlink RF signals to generate a downlink transport signal that is distributed to one or more of the remote antenna units 304. Each such remote antenna unit 304 receives the downlink transport signal and reconstructs a version of the downlink RF signals based on the downlink transport signal and causes the reconstructed downlink RF signals to be radiated from an antenna 416 coupled to or included in that remote antenna unit 304.

In some aspects, the master unit 302 is directly coupled to the remote antenna units 304. In such aspects, the master unit 302 is coupled to the remote antenna units 304 using cables 321. For example, the cables 321 can include optical fiber or Ethernet cable complying with the Category 5, Category 5e, Category 6, Category 6A, or Category 7 specifications. Future communication medium specifications used for Ethernet signals are also within the scope of the present disclosure.

A similar process can be performed in the uplink direction. RF signals transmitted from mobile devices 308 (also referred to herein as "uplink RF signals") are received at one or more remote antenna units 304 via an antenna 416. Each remote antenna unit 304 uses the uplink RF signals to generate an uplink transport signal that is transmitted from the remote antenna unit 304 to a master unit 302. The master unit 302 receives uplink transport signals transmitted from one or more remote antenna units 304 coupled to it. The master unit 302 can combine data or signals communicated via the uplink transport signals from multiple remote antenna units 304 (for example, where the DAS 300 is implemented as a digital DAS 300, by digitally summing corresponding digital samples received from the various remote antenna units 304) and generates uplink RF signals from the combined data or signals. In such examples, the master unit 302 communicates the generated uplink RF signals to one or more base stations 306. In this way, the coverage of the base stations 306 can be expanded using the DAS 300.

As noted above, in the example shown in FIG. 3, the DAS 300 is implemented as a digital DAS. In a "digital" DAS, signals received from and provided to the base stations 306 and mobile devices 308 are used to produce digital in-phase (I) and quadrature (Q) samples, which are communicated between the master unit 302 and remote antenna units 304. It is important to note that this digital IQ representation of the original signals received from the base stations 306 and from the mobile units still maintains the original modulation (that is, the change in the amplitude, phase, or frequency of a carrier) used to convey telephony or data information pursuant to the cellular air interface protocol used for wirelessly communicating between the base stations 306 and the mobile units. Examples of such cellular air interface protocols include, for example, the Global System for Mobile Communication (GSM), Universal Mobile Telecommunications System (UMTS), High-Speed Downlink Packet Access (HSDPA), Long-Term Evolution (LTE), Citizens Broadband Radio Service (CBRS), and fifth generation New Radio (5G NR) air interface protocols. Also, each stream of digital IQ samples represents or includes a portion of wireless spectrum. For example, the digital IQ samples can represent a single radio access network carrier (for example, a 5G NR carrier of 40 MHz or 400 MHz) onto which voice or data information has been modulated using a 5G NR air interface. However, it is to be understood that each such stream can also represent multiple carriers (for example, in a band of frequency spectrum or a sub-band of a given band of frequency spectrum).

In the example shown in FIG. 3, the master unit 302 can be configured to interface with one or more base stations 306 using an analog RF interface (for example, via the analog RF interface of an RRH or a small cell base station). In some examples, the base stations 306 can be coupled to the master unit 302 using a network of attenuators, combiners, splitters, amplifiers, filters, cross-connects, etc., which is referred to collectively as a point-of-interface (POI) 307. This is done so that, in the downlink, the desired set of RF carriers output by the base stations 306 can be extracted, combined, and routed to the appropriate master unit 302, and so that, in the uplink, the desired set of carriers output by the master unit 302 can be extracted, combined, and routed to the appropriate interface of each base station 306. In other examples, the POI 307 can be part of the master unit 302.

In the example shown in FIG. 3, in the downlink, the master unit 302 can produce digital IQ samples from an analog signal received at radio frequency (RF) by down-converting the received signal to an intermediate frequency (IF) or to baseband, digitizing the down-converted signal to produce real digital samples, and digitally down-converting the real digital samples to produce digital in-phase (I) and quadrature (Q) samples. These digital IQ samples can also be filtered, amplified, attenuated, and/or re-sampled or decimated to a lower sample rate. The digital samples can be produced in other ways. Each stream of digital IQ samples represents a portion of radio frequency spectrum output by one or more base stations 306. Each portion of radio frequency spectrum can include, for example, a band of wireless spectrum, a sub-band of a given band of wireless spectrum, or an individual wireless carrier.

Likewise, in the uplink, the master unit 302 can produce an uplink analog signal from one or more streams of digital IQ samples received from one or more remote antenna units 304 by digitally combining streams of digital IQ samples that represent the same carriers or frequency bands or sub-bands received from multiple remote antenna units 304 (for example, by digitally summing corresponding digital IQ samples from the various remote antenna units 304), digitally up-converting the combined digital IQ samples to produce real digital samples, performing a digital-to-analog process on the real samples in order to produce an IF or baseband analog signal, and up-converting the IF or baseband analog signal to the desired RF frequency. The digital IQ samples can also be filtered, amplified, attenuated, and/or re-sampled or interpolated to a higher sample rate, before and/or after being combined. The analog signal can be produced in other ways (for example, where the digital IQ samples are provided to a quadrature digital-to-analog converter that directly produces the analog IF or baseband signal).

In the example shown in FIG. 3, the master unit 302 can be configured to interface with one or more base stations 306 using a digital interface (in addition to, or instead of) interfacing with one or more base stations 306 via an analog RF interface. For example, the master unit 302 can be configured to interact directly with one or more BBUs using the digital IQ interface that is used for communicating between the BBUs and an RRHs (for example, using the CPRI serial digital IQ interface).

In the downlink, the master unit 302 terminates one or more downlink streams of digital IQ samples provided to it from one or more BBUs and, if necessary, converts (by re-sampling, synchronizing, combining, separating, gain adjusting, etc.) them into downlink streams of digital IQ samples compatible with the remote antenna units 304 used in the DAS 300. In the uplink, the master unit 302 receives uplink streams of digital IQ samples from one or more remote antenna units 304, digitally combining streams of digital IQ samples that represent the same carriers or frequency bands or sub-bands received from multiple remote antenna units 304 (for example, by digitally summing corresponding digital IQ samples received from the various remote antenna units 304), and, if necessary, converts (by re-sampling, synchronizing, combining, separating, gain adjusting, etc.) them into uplink streams of digital IQ samples compatible with the one or more BBUs that are coupled to that master unit 302.

In the downlink, each remote antenna unit 304 receives streams of digital IQ samples from the master unit 302, where each stream of digital IQ samples represents a portion of wireless radio frequency spectrum output by one or more base stations 306. Each remote antenna unit 304 generates, from the downlink digital IQ samples, one or more downlink RF signals for radiation from the one or more antennas coupled to that remote antenna unit 304 for reception by any mobile devices 308 in the associated coverage area. In the uplink, each remote antenna unit 304 receives one or more uplink radio frequency signals transmitted from any mobile devices 308 in the associated coverage area, generates one or more uplink streams of digital IQ samples derived from the received one or more uplink radio frequency signals, and transmits them to the master unit 302.

Each remote antenna unit 304 can be communicatively coupled directly to one or more master units 302 or indirectly via one or more other remote antenna units 304 and/or via one or more intermediate units 316 (also referred to as "expansion units" or "transport expansion nodes"). The latter approach can be done, for example, in order to increase the number of remote antenna units 304 that a single master unit 302 can feed, to increase the master-unit-to-remote-antenna-unit distance, and/or to reduce the amount of cabling needed to couple a master unit 302 to its associated remote antenna units 304. The expansion units are coupled to the master unit 302 via one or more cables 421.

In the example DAS 300 shown in FIG. 3, a remote antenna unit 304 is shown having another co-located remote antenna unit 305 (also referred to herein as an "extension unit") communicatively coupled to it. Subtending a co-located extension remote antenna unit 305 from another remote antenna unit 304 can be done in order to expand the number of frequency bands that are radiated from that same location and/or to support MIMO service (for example, where different co-located remote antenna units radiate and receive different MIMO streams for a single MIMO frequency band). The remote antenna unit 304 is communicatively coupled to the "extension" remote antenna units 305 using a fiber optic cable, a multi-conductor cable, coaxial cable, or the like. In such an implementation, the remote antenna units 305 are coupled to the master unit 302 of the DAS 300 via the remote antenna unit 304.

In some examples, one or more components of the DAS 300 include the ESD protection circuit 100 as described above. For example, the master unit 302 and/or remote antenna units 304, 305 can include the ESD protection circuit 100 in order to prevent damage to components of the master unit 302 and/or remote antenna units 304, 305. In some examples, an ESD protection circuit 100 is positioned in the uplink path and/or downlink path in the master unit 302. In some examples, an ESD protection circuit 100 is positioned in the uplink path and/or downlink path in one or more remote antenna units 304, 305.

Figure 4:
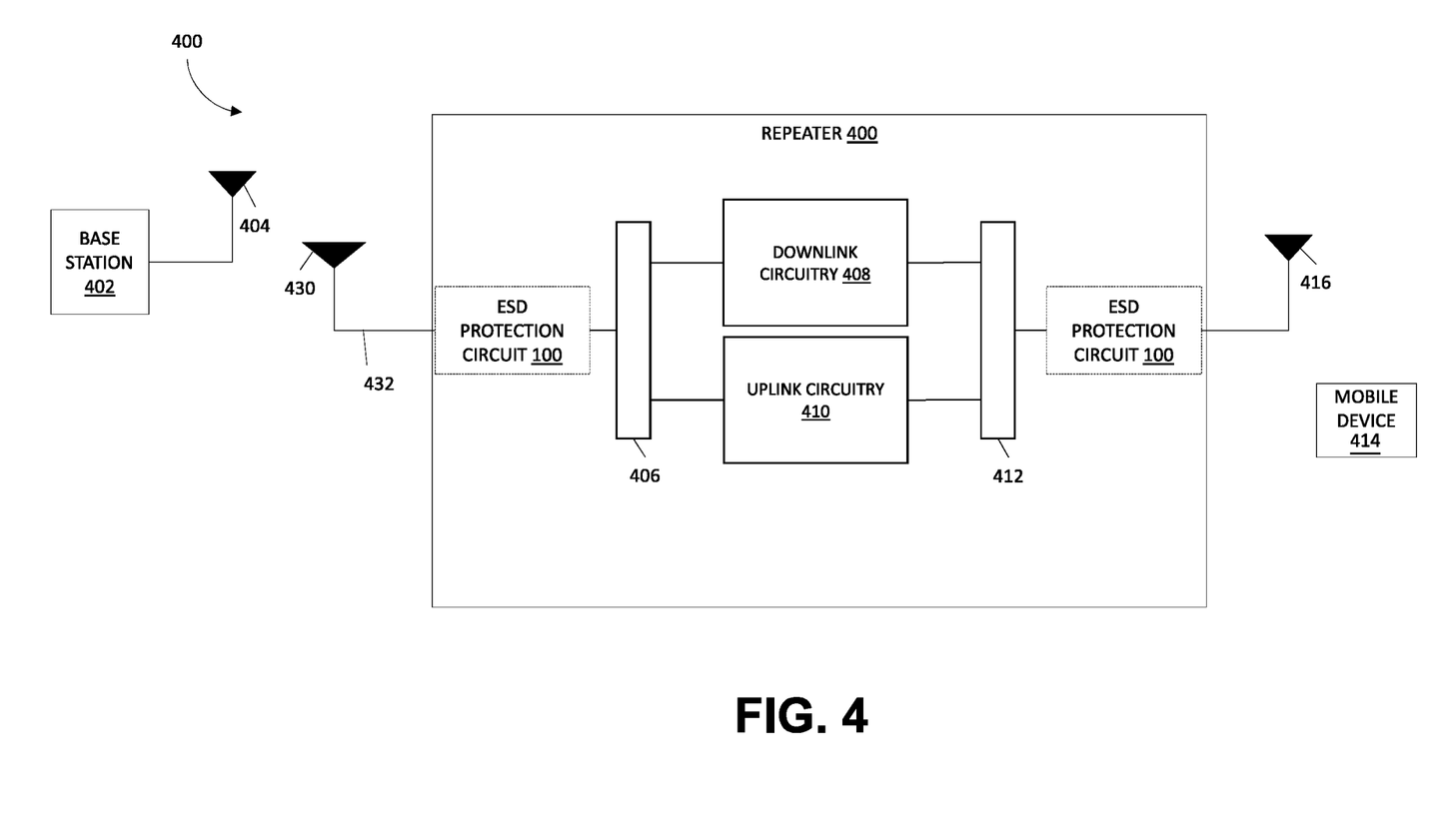
FIG. 4 is a block diagram illustrating an example repeater system utilizing an ESD protection circuit.

Other types of radio frequency distribution systems can also benefit from the ESD protection circuit described above. FIG. 4 illustrates an example of a single-node repeater 400 that includes the ESD protection circuit 100 as discussed above.

In the exemplary embodiment shown in FIG. 4, the single-node repeater 400 is coupled to one or more base stations 402 using a donor antenna 430.

The single-node repeater 400 comprises a first duplexer 406 having a common port that is coupled to the donor antenna 430 via a cable 432, a downlink port that is coupled to downlink circuitry 408, and an uplink port that is coupled to uplink circuitry 410. The single-node repeater 400 comprises a second duplexer 412 having a common port that is coupled to the coverage antenna 416, a downlink port that is coupled to the downlink circuitry 408, and an uplink port that is coupled to the uplink circuitry 410.

In general, the single-node repeater 400 is configured to receive one or more downlink signals from one or more base stations 402. Each base station downlink signal includes one or more radio frequency channels used for communicating in the downlink direction with user equipment 414 over the relevant one or more wireless air interfaces. The downlink circuitry 408 is configured to amplify the downlink signals received at the repeater 400 and re-radiate the amplified downlink signals via the coverage antenna 416. As a part of doing this, the downlink circuitry 408 can be configured to filter the downlink signals to separate out the individual channels, individually amplify each filtered downlink channel signal, combine the individually amplified downlink channel signals, and re-radiate the resulting combined signal.

Similar processing is performed in the uplink. The single-node repeater 400 is configured to receive one or more uplink signals from mobile device 414. Each mobile device uplink signal includes one or more radio frequency channels used for communicating in the uplink direction with one or more base stations 402 over the relevant one or more wireless air interfaces. The uplink circuitry 410 is configured to amplify the uplink signals received at the repeater 400 and re-radiate the amplified uplink signals via the donor antenna 430. As a part of doing this, the uplink circuitry 410 can be configured to filter the uplink signals to separate out the individual channels, individually amplify each filtered uplink channel signal, combine the individually amplified uplink channel signals, and re-radiate the resulting combined signal.

The single-node repeater 400 can be configured to implement one or more features to provide sufficient isolation between the donor antenna 430 and the coverage antenna 416. These features can include gain control circuitry and adaptive cancellation circuitry. Other features can be implemented. These features can be implemented in one or more of the downlink circuitry 408 and/or the uplink circuitry 410. These features can also be implemented in separate circuitry.

The single-node repeater 400 can also include an ESD protection circuit 100 as described above. The single-node repeater 400 can include one or more ESD protection circuits 100 in order to prevent damage to components of the single-node repeater 400. In some examples, an ESD protection circuit 100 is positioned between the donor antenna 430 and the duplexer 406 and/or an ESD protection circuit 100 is positioned between the duplexer 412 and the coverage antenna 416.

The various circuitry and features of the single-node repeater 400 can be implemented in analog circuitry, digital circuitry, or combinations of analog circuitry and digital circuitry. The downlink circuitry 408 and uplink circuitry 410 can comprise one or more appropriate connectors, attenuators, combiners, splitters, amplifiers, filters, duplexers, analog-to-digital converters, digital-to-analog converters, electrical-to-optical converters, optical-to-electrical converters, mixers, field-programmable gate arrays (FPGAs), microprocessors, transceivers, framers, etc., to implement the features described above. Also, the downlink circuitry 408 and uplink circuitry 410 may share common circuitry and/or components.

In various aspects, system elements, method steps, or examples described throughout this disclosure (such as the distributed antenna system, repeater, or components thereof, for example) may be implemented on one or more computer systems, field programmable gate array (FPGA), application specific integrated circuit (ASIC) or similar devices comprising hardware executing code to realize those elements, processes, or examples, said code stored on a non-transient data storage device. These devices include or function with software programs, firmware, or other computer readable instructions for carrying out various methods, process tasks, calculations, and control functions.

These instructions are typically stored on any appropriate computer readable medium used for storage of computer readable instructions or data structures. The computer readable medium can be implemented as any available media that can be accessed by a general purpose or special purpose computer or processor, or any programmable logic device. Suitable processor-readable media may include storage or memory media such as magnetic or optical media. For example, storage or memory media may include conventional hard disks, Compact Disk-Read Only Memory (CD-ROM), volatile or non-volatile media such as Random Access Memory (RAM) (including, but not limited to, Synchronous Dynamic Random Access Memory (SDRAM), Double Data Rate (DDR) RAM, RAMBUS Dynamic RAM (RDRAM), Static RAM (SRAM), etc.), Read Only Memory (ROM), Electrically Erasable Programmable ROM (EEPROM), and flash memory, etc. Suitable processor-readable media may also include transmission media such as electrical, electromagnetic, or digital signals, conveyed via a communication medium such as a network and/or a wireless link.

The methods and techniques described here may be implemented in digital electronic circuitry, or with a programmable processor (for example, a special-purpose processor or a general-purpose processor such as a computer) firmware, software, or in combinations of them. Apparatus embodying these techniques may include appropriate input and output devices, a programmable processor, and a storage medium tangibly embodying program instructions for execution by the programmable processor. A process embodying these techniques may be performed by a programmable processor executing a program of instructions to perform desired functions by operating on input data and generating appropriate output. The techniques may advantageously be implemented in one or more programs that are executable on a programmable system including at least one programmable processor coupled to receive data and instructions from, and to transmit data and instructions to, a data storage system, at least one input device, and at least one output device. Generally, a processor will receive instructions and data from a read-only memory and/or a random-access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and DVD disks. Any of the foregoing may be supplemented by, or incorporated in, specially-designed application-specific integrated circuits (ASICs).

Example Embodiments

Example 1 includes a system, comprising: a radio frequency port coupled to an external connector; a microstrip line coupled to the radio frequency port and one or more components mounted on a printed circuit board; and a short coupled to the microstrip line and a ground reference, wherein the short is coupled to the microstrip line proximate the radio frequency port.

Example 2 includes the system of Example 1, wherein the short is configured to have a higher characteristic impedance than the microstrip line.

Example 3 includes the system of any of Examples 1-2, wherein a length of the short is a quarter wavelength of an operating frequency for radio frequency signals transmitted or received via the radio frequency port.

Example 4 includes the system of any of Examples 1-3, wherein the ground reference comprises a ground pin of the radio frequency port.

Example 5 includes the system of any of Examples 1-4, wherein the short is configured to operate as an open circuit for an operating frequency for radio frequency signals transmitted or received via the radio frequency port.

Example 6 includes the system of any of Examples 1-5, wherein the short is configured to suppress one or more harmonics of an operating frequency for radio frequency signals transmitted or received via the radio frequency port.

Example 7 includes the system of any of Examples 1-6, wherein the one or more components mounted on the printed circuit board include at least one of: a power amplifier; or a duplexer.

Example 8 includes the system of any of Examples 1-7, wherein the microstrip line includes one or more mitered corners between the radio frequency port and the one or more components mounted on the printed circuit board.

Example 9 includes the system of any of Examples 1-8, wherein the printed circuit board is a multi-layer printed circuit board comprising a plurality of ground vias.

Example 10 includes a unit of a repeater system, comprising: downlink circuitry configured to receive downlink signals sourced from a base station and to output a gain-adjusted downlink signal to one or more user equipment in a coverage area of the repeater system; uplink circuitry configured to receive uplink signals from one or more user equipment in the coverage area of the repeater system and to output a gain-adjusted uplink signal to the base station; a radio frequency port coupled to an external connector; a microstrip line coupled to the radio frequency port and the downlink circuitry and/or the uplink circuitry; and a short coupled to the microstrip line and a ground reference, wherein the short is coupled to the microstrip line proximate the radio frequency port.

Example 11 includes the unit of Example 10, wherein the unit is a single-node repeater.

Example 12 includes the unit of any of Examples 10-11, wherein the unit is a master unit of a distributed antenna system, wherein the master unit is communicatively coupled to one or more remote antenna units that are located remotely from the master unit.

Example 13 includes the unit of any of Examples 10-12, wherein the unit is a remote antenna unit of a distributed antenna system, wherein the distributed antenna system comprises a master unit communicatively coupled to the remote antenna unit, wherein the remote antenna unit is located remotely from the master unit.

Example 14 includes the unit of any of Examples 10-13, wherein the short is configured to have a higher characteristic impedance than the microstrip line.

Example 15 includes the unit of any of Examples 10-14, wherein a length of the short is a quarter wavelength of an operating frequency for radio frequency signals transmitted or received via the radio frequency port.

Example 16 includes the unit of any of Examples 10-15, wherein the ground reference comprises a ground pin of the radio frequency port of the unit.

Example 17 includes the unit of any of Examples 10-16, wherein the short is configured to operate as an open circuit for an operating frequency for radio frequency signals transmitted or received via the radio frequency port.

Example 18 includes the unit of any of Examples 10-17, wherein the short is configured to suppress one or more harmonics of an operating frequency for radio frequency signals transmitted or received via the radio frequency port.

Example 19 includes the unit of any of Examples 10-18, wherein the downlink circuitry and/or the uplink circuitry is mounted on the printed circuit board, wherein the microstrip line includes one or more mitered corners between the radio frequency port and the downlink circuitry and/or uplink circuitry mounted on the printed circuit board.

Example 20 includes the unit of any of Examples 10-19, wherein the downlink circuitry and/or the uplink circuitry is mounted on the printed circuit board, wherein the printed circuit board is a multi-layer printed circuit board comprising a plurality of ground vias.

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

What is claimed is:

1. A system, comprising:
  a radio frequency port coupled to an external connector;
  a microstrip line coupled to the radio frequency port and one or more components mounted on a printed circuit board; and
  a short coupled to the microstrip line and a ground reference, wherein the short is coupled to the microstrip line proximate the radio frequency port, wherein the short is configured to have a higher characteristic impedance than the microstrip line, wherein the short is configured to suppress one or more harmonics of an operating frequency for radio frequency signals transmitted or received via the radio frequency port.

2. The system of claim 1, wherein a length of the short is a quarter wavelength of an operating frequency for radio frequency signals transmitted or received via the radio frequency port.

3. The system of claim 1, wherein the ground reference comprises a ground pin of the radio frequency port.

4. The system of claim 1, wherein the short is configured to operate as an open circuit for an operating frequency for radio frequency signals transmitted or received via the radio frequency port.

5. The system of claim 1, wherein the one or more components mounted on the printed circuit board include at least one of:
  a power amplifier; or
  a duplexer.

6. The system of claim 1, wherein the microstrip line includes one or more mitered corners between the radio frequency port and the one or more components mounted on the printed circuit board.

7. The system of claim 1, wherein the printed circuit board is a multi-layer printed circuit board comprising a plurality of ground vias.

8. A unit of a repeater system, comprising:
  downlink circuitry configured to receive downlink signals sourced from a base station and to output a gain-adjusted downlink signal to one or more user equipment in a coverage area of the repeater system;
  uplink circuitry configured to receive uplink signals from one or more user equipment in the coverage area of the repeater system and to output a gain-adjusted uplink signal to the base station;
  a radio frequency port coupled to an external connector;
  a microstrip line coupled to the radio frequency port and the downlink circuitry and/or the uplink circuitry; and
  a short coupled to the microstrip line and a ground reference, wherein the short is coupled to the microstrip line proximate the radio frequency port, wherein the short is configured to have a higher characteristic impedance than the microstrip line, wherein the short is configured to suppress one or more harmonics of an operating frequency for radio frequency signals transmitted or received via the radio frequency port.

9. The unit of claim 8, wherein the unit is a single-node repeater.

10. The unit of claim 8, wherein the unit is a master unit of a distributed antenna system, wherein the master unit is communicatively coupled to one or more remote antenna units that are located remotely from the master unit.

11. The unit of claim 8, wherein the unit is a remote antenna unit of a distributed antenna system, wherein the distributed antenna system comprises a master unit communicatively coupled to the remote antenna unit, wherein the remote antenna unit is located remotely from the master unit.

12. The unit of claim 8, wherein a length of the short is a quarter wavelength of an operating frequency for radio frequency signals transmitted or received via the radio frequency port.

13. The unit of claim 8, wherein the ground reference comprises a ground pin of the radio frequency port of the unit.

14. The unit of claim 8, wherein the short is configured to operate as an open circuit for an operating frequency for radio frequency signals transmitted or received via the radio frequency port.

15. The unit of claim 8, wherein the downlink circuitry and/or the uplink circuitry is mounted on a printed circuit board, wherein the microstrip line includes one or more mitered corners between the radio frequency port and the downlink circuitry and/or uplink circuitry mounted on the printed circuit board.

16. The unit of claim 8, wherein the downlink circuitry and/or the uplink circuitry is mounted on a printed circuit board, wherein the printed circuit board is a multi-layer printed circuit board comprising a plurality of ground vias.

\* \* \* \* \*